United States Patent
Mess

(10) Patent No.: US 6,472,252 B2
(45) Date of Patent: *Oct. 29, 2002

(54) METHODS FOR BALL GRID ARRAY (BGA) ENCAPSULATION MOLD

(75) Inventor: Leonard E. Mess, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,564

(22) Filed: Jun. 21, 2001

(65) Prior Publication Data

US 2001/0044171 A1 Nov. 22, 2001

Related U.S. Application Data

(63) Continuation of application No. 09/430,222, filed on Oct. 29, 1999, now Pat. No. 6,335,221, which is a division of application No. 09/352,479, filed on Jul. 13, 1999, now Pat. No. 6,164,946, which is a continuation of application No. 08/898,812, filed on Jul. 23, 1997, now Pat. No. 5,923,959.

(51) Int. Cl.[7] ................. H01L 21/44; H01L 21/48; H01L 21/50

(52) U.S. Cl. ............... 438/126; 438/124; 438/125; 438/127

(58) Field of Search ................. 438/106, 126, 438/125, 127, 124; 425/125, 127, 183, 544; 249/102; 246/272.15, 272.17

(56) References Cited

U.S. PATENT DOCUMENTS

| | | | |
|---|---|---|---|
| 4,313,718 A | * | 2/1982 | Llabres et al. ............. 264/107 |
| 4,697,784 A | | 10/1987 | Schmid |
| 4,881,884 A | | 11/1989 | De'Ath |
| 4,944,908 A | | 7/1990 | Leveque et al. |
| 5,147,821 A | | 9/1992 | McShane et al. |
| 5,355,283 A | | 10/1994 | Marrs et al. |
| 5,362,679 A | | 11/1994 | Wakefield |
| 5,405,255 A | | 4/1995 | Neu |
| 5,406,699 A | | 4/1995 | Oyama |
| 5,467,253 A | | 11/1995 | Heckman et al. |
| 5,468,999 A | | 11/1995 | Lin et al. |
| 5,474,958 A | | 12/1995 | Djennas et al. |
| 5,477,611 A | | 12/1995 | Sweis et al. |
| 5,479,051 A | | 12/1995 | Waki et al. |
| 5,490,324 A | | 2/1996 | Newman |
| 5,506,756 A | | 4/1996 | Haley |
| 5,508,565 A | | 4/1996 | Hatakeyama et al. |
| 5,527,743 A | | 6/1996 | Variot |
| 5,543,658 A | | 8/1996 | Hosokawa et al. |
| 5,545,922 A | | 8/1996 | Golwalkar et al. |
| 5,556,807 A | | 9/1996 | Bhattacharyya et al. |
| 5,596,227 A | | 1/1997 | Saito |
| 5,609,889 A | | 3/1997 | Weber |
| 5,626,886 A | | 5/1997 | Ishii |
| 5,656,549 A | | 8/1997 | Woosley et al. |
| 5,663,106 A | | 9/1997 | Karavakis et al. |
| 5,665,281 A | | 9/1997 | Drummond |
| 5,688,716 A | | 11/1997 | DiStefano et al. |
| 5,766,649 A | * | 6/1998 | Azuma ................. 249/135 |
| 5,766,650 A | | 6/1998 | Peters et al. |
| 5,817,545 A | * | 10/1998 | Wang et al. ............. 438/126 |
| 5,876,765 A | * | 3/1999 | Hinterlechner ......... 264/272.17 |
| 5,923,959 A | * | 7/1999 | Mess ..................... 438/106 |
| 5,928,595 A | * | 7/1999 | Knapp et al. ........... 264/272.17 |
| 6,117,382 A | * | 9/2000 | Thummel ............... 264/272.14 |
| 6,281,588 B1 | * | 8/2001 | Di Stefano et al. ......... 257/686 |

FOREIGN PATENT DOCUMENTS

JP 04196548 * 7/1992 ........... H01L/21/56

* cited by examiner

Primary Examiner—Wael Fahmy
Assistant Examiner—Brook Kebede
(74) Attorney, Agent, or Firm—TraskBritt

(57) ABSTRACT

A molding machine for encapsulating electronic devices mounted on one side of a substrate, and having a ball-grid array, pin-grid array, or land-grid array on the opposite side, has a two member biased floating plate apparatus to compensate for variations in substrate thickness, and a gas collection/venting apparatus for relieving gases emitted from the non-encapsulated underside of the substrate.

15 Claims, 6 Drawing Sheets

METHODS FOR BALL GRID ARRAY (BGA) ENCAPSULATION MOLD

CROSS REFERENCE TO RELATED APPLICATION

This application is a continuation of application Ser. No. 09/430,222, filed Oct. 29, 1999, now U.S. Pat. No. 6,335,221 B1 issued Jan. 1, 2002, which is a divisional of application Ser. No. 09/352,479, filed Jul. 13, 1999, now U.S. Pat. No. 6,164,946, issued Dec. 26, 2000, which is a continuation of application Ser. No. 08/898,812, filed Jul. 23, 1997, now U.S. Pat. No. 5,923,959, issued Jul. 13, 1999.

BACKGROUND OF THE INVENTION

1. Field of the Invention

This invention relates generally to semiconductor devices having molded housings. More particularly, the invention pertains to a mold for encapsulating integrated circuits (ICs) which include arrays of conductive balls, pins, or pads on substrates.

2. State of the Art

Modem packaged integrated circuits (ICs) comprise one or more encapsulated semiconductor dies or chips within a protective "package" of plastic or other moldable material. The integrated circuit chips are made from a semiconductor material such as silicon, germanium or gallium arsenide, and microscopic circuits are formed on a surface of each chip by photolithographic techniques. A plurality of external connections, typically designed for soldering, is connected to bond pads on one or more encapsulated chips, enabling the chips to be electrically interconnected to an external electrical apparatus. In one form of interconnection, a substrate such as a wiring board or circuit board has an array of conductors which is typically connected to the wire bond pads of the chips and which extends through the substrate to the opposite side for conductive, e.g. solder, connection to an electronic apparatus. In addition to one or more chips attached to the substrate in either packaged or unpackaged form, other devices such as resisters, capacitors, etc. may be mounted to the substrate and incorporated in the circuit.

Plastic encapsulation of semiconductor and other electronic devices by transfer molding is a well-known and much-used technique. Typically, a large number of components or devices is placed in a lower mold plate or half of an open multi-cavity mold, with one or more devices within each cavity. The mold is closed with a mating upper plate. The cavities of the mold are connected by "runners", i.e. channels to a "pot" or reservoir from which pressurized liquified plastic is fed. Typically, constricted channels known as "gates" are located at the entrance to each mold cavity to limit the flow rate and injection velocity of liquified plastic into the cavity.

Where it is desired to encapsulate a circuit board or wiring board upon which one or more semiconductor devices have been mounted and wired, a peripheral portion of the board (or of a portion encompassing a mounted circuit) is compressed between the upper and lower plates to prevent leakage of liquified plastic from the mold cavity. Typically, the force required to compress the platen together is of the order of tons, even for molding machines having only a few mold cavities.

Typically, powdered or pelletized plastic, e.g. thermoset resin, is placed in the resin pot and compressed by a ram. The heated, pressurized plastic becomes liquified and flows through the runners and gates to surround each device and fill each mold cavity, where it subsequently hardens to encapsulate the board and the devices attached to it. Air is expelled from each cavity through one or more runners as the plastic melt fills the mold cavities. Following hardening by partial cure of the thermoset plastic, the mold plates are separated along the parting line and the encapsulated devices are removed and trimmed of excess plastic which has solidified in the runners and gates. Additional thermal treatment completes curing of the plastic package.

Following removal of each encapsulated unit from its mold cavity and curing, the peripheral portions of the board may be excised from the board and any flash is removed as known in the art, and the device is ready for use.

In many devices having a ball grid array (BGA) or similar array on a circuit board, the molding process is conducted so that the surface of the circuit board having the array connections forms an outer surface of the package, not being covered by the plastic material. Thus, any plastic which has solidified on the array connection surface is removed.

In most devices, the substrate material which is clamped between the platens may be variable in thickness or density from lot to lot, or may actually change in thickness during the molding process due to compression and/or release of gases therefrom. It is known, of course, that the high compression forces will typically compress a circuit board significantly. The variation in thickness at a given compression force may be ±5 mils or more. Unless there is compensation for this variability, a thinner-than-normal circuit board may result in leakage of encapsulant plastic past the mating portions of the upper and lower mold plates.

In U.S. Pat. No. 5,609,889 of Weber, a mold is described which has a biased plug that exerts pressure on a heat sink or circuit board to prevent molding compound from covering the heat sink or circuit board. A passage is provided in the substrate circuit board so that plastic flows latitudinally under the circuit board into a cavity. The plug is biased by a plate spring to accommodate variations in the thickness of the substrate and ensure that the exterior surface of the heat sink does not become significantly encased in plastic. The pressure exerted by the plate spring need only be nominal, enough to hold the circuit board or heat sink against the "floor" of the mold cavity. The circuit board is not clamped between the plate walls, so any variation in thickness of the board will not cause leakage of plastic past the mating plate surfaces.

It has been discovered that gases are commonly released from substrates such as circuit boards during transfer molding, presumably because of substrate compression as well as degasification due to the elevated molding temperatures. Mold plates which clamp a substrate about a mounted IC device are completely sealed on the side of the substrate which is not to be encapsulated. The buildup of gases (and pressure) on one side of the substrate may cause temporary warping of the substrate. Upon removal from the mold plates, the residual forces in the substrate may cause cracking, spalling, etc. in the package.

SUMMARY OF THE INVENTION

The present invention provides a molding machine for providing one-side encapsulation of electronic devices having a substrate such as a circuit board upon which are mounted integrated circuits (ICs) optionally with other apparatus such as resistors and capacitors.

The present invention also provides a molding machine having means to compensate for batch-to-batch variations in substrate thickness. The present invention provides substrate thickness compensation which automatically adjusts for variations in substrate thickness about a nominal thickness, and which is easily adjustable for different nominal substrate thicknesses. The present invention provides a molding apparatus having substrate thickness compensation which is readily usable with existing commercial molding machines.

The present invention further provides apparatus for venting gases released from a substrate during one-side molding encapsulation of an electronic apparatus mounted on the substrate.

The present invention further provides apparatus which is easily constructed from existing components at low cost.

The invention comprises improvements in a molding machine for encapsulating electronic devices mounted on the first side of a substrate such as a circuit board or wiring board, as exemplified by a board having a ball-grid-array (BGA), pin-grid-array (PGA), land-grid-array (LGA) or similar set of multiple electrical terminals on its opposite side. Such a circuit board is configured to have the array terminals bonded to another apparatus following encapsulation of the electronic devices including chip(s), wiring and other devices on its first side.

One aspect of the invention comprises a biased floating plate apparatus which comprises a floating plate, which may be a mold plate or a platen, and a second member attached to the floating plate. The second member may be a mold chase, for example. A biasing means associated with the second member biases the combination toward a first thickness dimension t, at which no outward force is exerted by the floating plate apparatus. A compressive force P is required to diminish the thickness t of the apparatus, and the inverse relationship between the compressive force P and thickness t is readily adjustable over a desired working range. The biased floating plate apparatus is positioned within the compression train of the molding machine to provide the desired compensation for inherent or process-caused variations in substrate thickness. The floating plate is biased by a plurality of springs or other force-compressible means or suitable resilient means spacedly mounted in the second member, a mold chase, for example.

Another aspect of the invention comprises a relief area and vent within the cavity, on the lower mold plate, covering all or a portion of the "floor" of each mold cavity. The relief area and vent serve to collect and discharge gases emitted by the substrate. The emission of such gases is due to compression at the clamped portions of the substrate, and the increased temperature during encapsulation. Unless relieved, the pressure from such gases may warp the substrate during encapsulation. Return of the substrate to its original planar position after removal from the mold may lead to cracking and spalling of the encapsulant from the substrate. Use of the relief area and vent of the invention results in a stable electronic package.

The combination of the biased floating plate apparatus and plate relief/vent provides a molding machine with significant advantages in production methodology, including an increase in production up-time and cost-effectiveness.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

An improved molding machine for semiconductors and/or other devices mounted on a substrate such as a circuit board is provided. The several aspects of the invention are particularly applicable to substrate-mounted arrays of ball grids, pin grids and land-grids with various encapsulatable devices mounted on the opposite side of the substrate.

Figure 1:
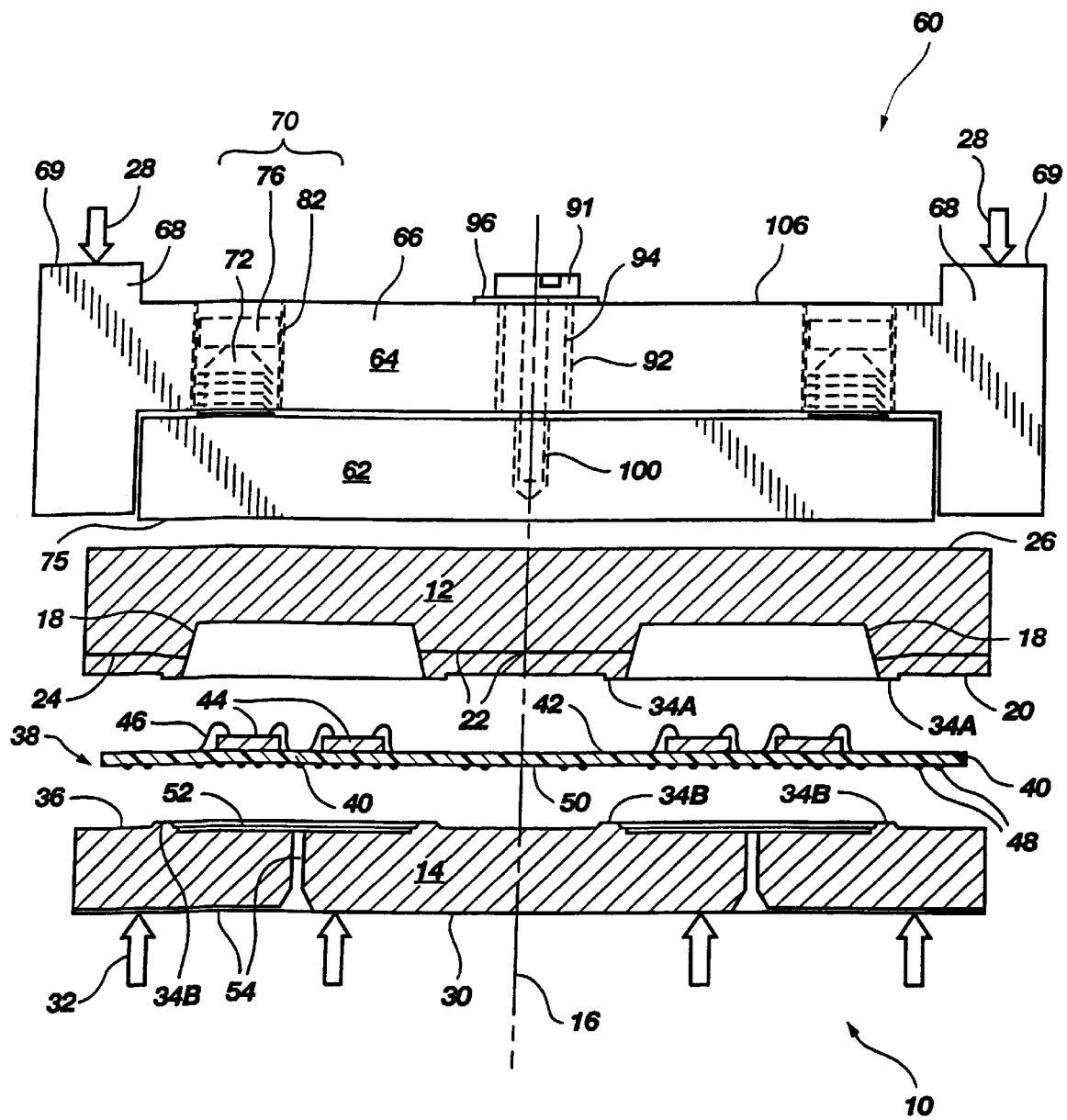
FIG. 1 is an exploded side view of a portion of a molding machine for encapsulating semiconductor devices and other devices mounted on a substrate, and depicting a mold chase, floating biased plate and lower mold plate of the biased floating plate apparatus of the invention.

With reference to the drawings of FIGS. 1–5, and particularly to FIG. 1, portions of a molding machine 10 are depicted, including an upper mold plate 12 and a lower mold plate 14. For the sake of easy depiction, it is assumed that the portions illustrated to the right of center line 16 are mirror images of the portions to the left of the center line.

The portions illustrated and described are those which pertain directly to the invention. Thus, a mold heater is generally included in the compression train of a molding machine 10 and may be located immediately below the lower mold plate 14, for example. It is not shown nor described herein, not being directly related to the invention.

The terms "upper" and "lower" are used consistently herein for the sake of convenience only, inasmuch as the upper and lower mold plates may be inverted in position.

An upper mold plate 12 is shown as a conventional, generally rectangular plate member with multiple cavities 18 along its lower flat surface 20. Each cavity 18 has a feed runner 22 for injecting the cavity with melted plastic, typically a thermoset resin, and a vent runner 24 for venting gas from the cavity during encapsulation. The upper mold plate 12 generally has a flat upper surface 26 upon which force 28 is applied to clamp the upper mold plate 12 to a mating lower mold plate 14 for encapsulation without leakage.

A lower mold plate 14 is shown as generally having a flat lower surface 30 upon which a clamping force 32 may be exerted. The upper mold plate 12 is shown with raised clamping ridges 34A extending about each portion of the substrate 40 to be encapsulated. Lower mold plate 14 is shown with raised clamping ridges 34B which "mate" to ridges 34A when the mold plates 12 and 14 are clamped over a substrate 40.

Figure 5:
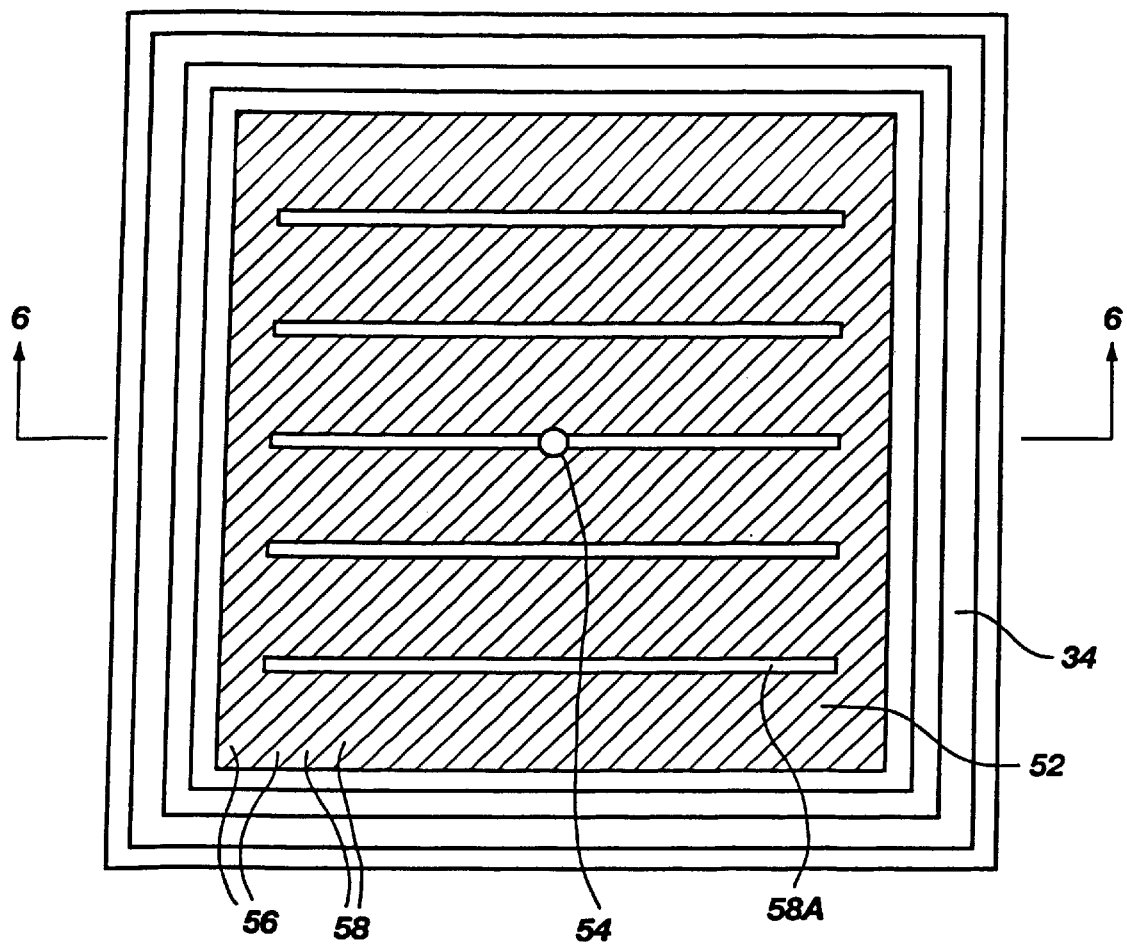
FIG. 5 is an enlarged top view of a portion of a lower mold plate including a gas collection/venting apparatus of the invention.
Figure 6:
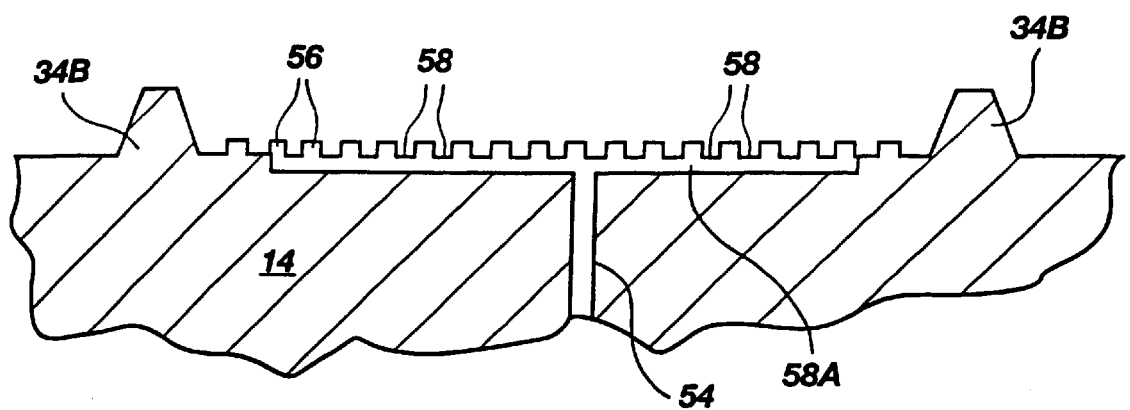
FIG. 6 is a cross-sectional side view of a portion of a lower mold plate including gas collection/venting apparatus of the invention, as taken along line 6—6 of FIG. 5.

In one aspect of the invention, a raised relief portion 52 and through-vent 54 are formed in the lower mold plate 14 for collecting and venting gases emitted by a substrate 40 during the encapsulation process. As illustrated in FIGS. 1, 5 and 6, the raised relief portion 52 comprises a pattern of ridges-and-valleys leading to the through-vent 54 which is shown passing through the lower mold plate 14 to the atmosphere. The total relief between the tops of ridges 56 and the bottoms of the striated valleys 58 need not be large, and may be, e.g., about twenty five (25) microns to about one hundred (100) microns. FIG. 6 shows elevations exaggerated for the sake of clarity, and includes a plurality of lowermost valleys 58A, one of which intersects the through-vent 54. Preferably, the relief portion 52 covers at least about one-fourth of the exposed area of the substrate underside 50, i.e. within clamping ridges 34B, and has an elevation which avoids possible damage to the solder balls, pins or lands (pads) on the substrate underside 50. However, the pattern of ridges 56 and valleys 58 may be of any arrangement which will collect and vent gases from the non-encapsulated side of the substrate. The venting of gases from the substrate avoids the problems which such gas buildup and accompanying pressure rise can create.

An example of an electronic apparatus 38 which may be encapsulated in the molding machine 10 is shown as including substrate 40 such as a circuit board having a first side 42 upon which are mounted one or more semiconductor chips 44 and/or resisters and/or capacitors and/or other electronic devices, not shown, together with interconnected conduits including, for example, fine wires 46. In this configuration, conduits on the first side 42 of the substrate 40 are connected through the substrate to a grid array of solder balls, pins or lands 48 on the underside (second side) 50 of the substrate. Such are well-known in the art. This particular type of electronic apparatus 38 is designed to be encapsulated only on the first side 42, leaving the ball-grid-array uncovered for electrical attachment to another apparatus, not shown. In FIG. 1, each apparatus to be encapsulated is shown as having two chips.

Figure 2:
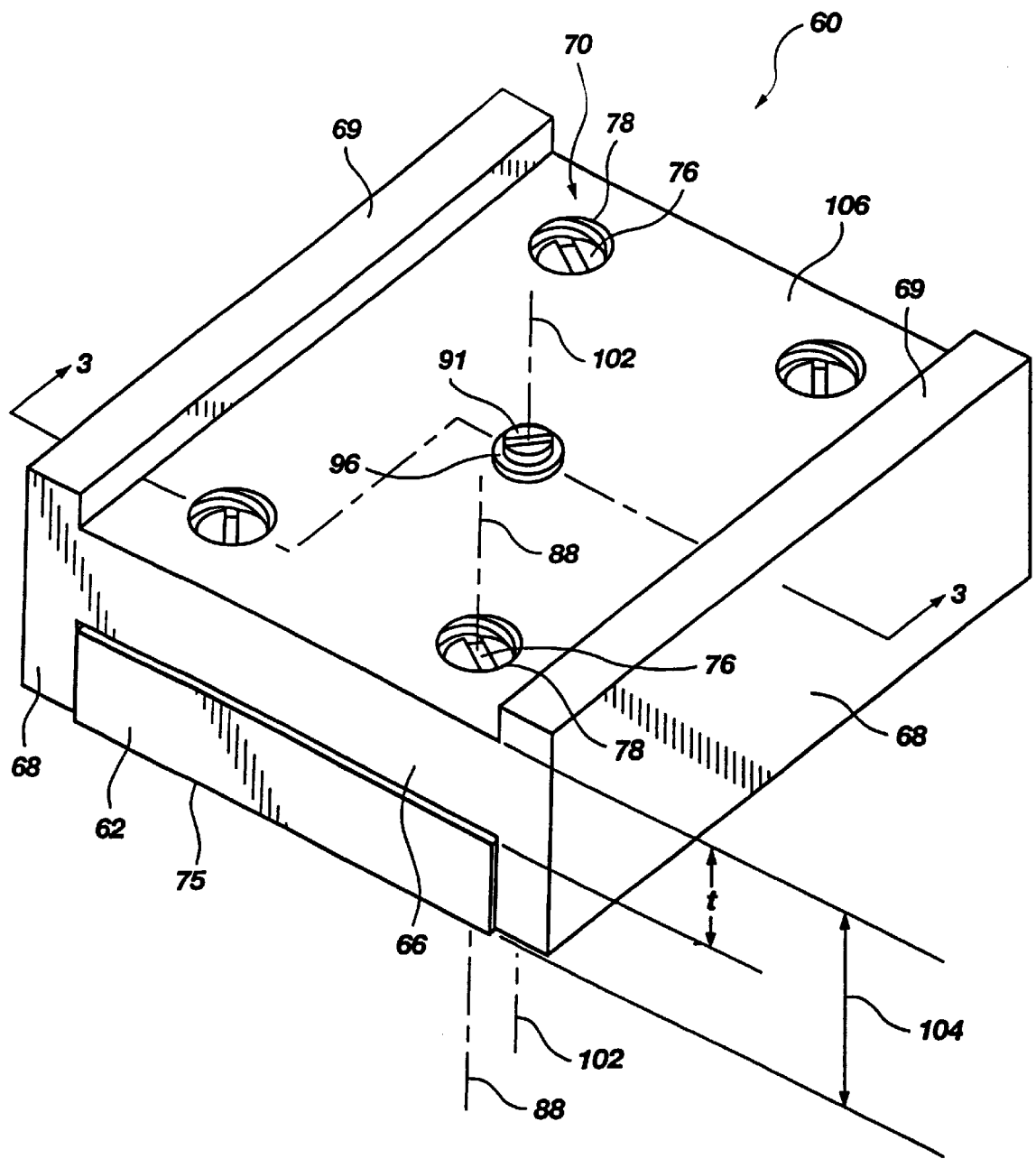
FIG. 2 is a perspective view showing a mold chase and floating biased plate of the biased floating plate apparatus of the invention.
Figure 3:
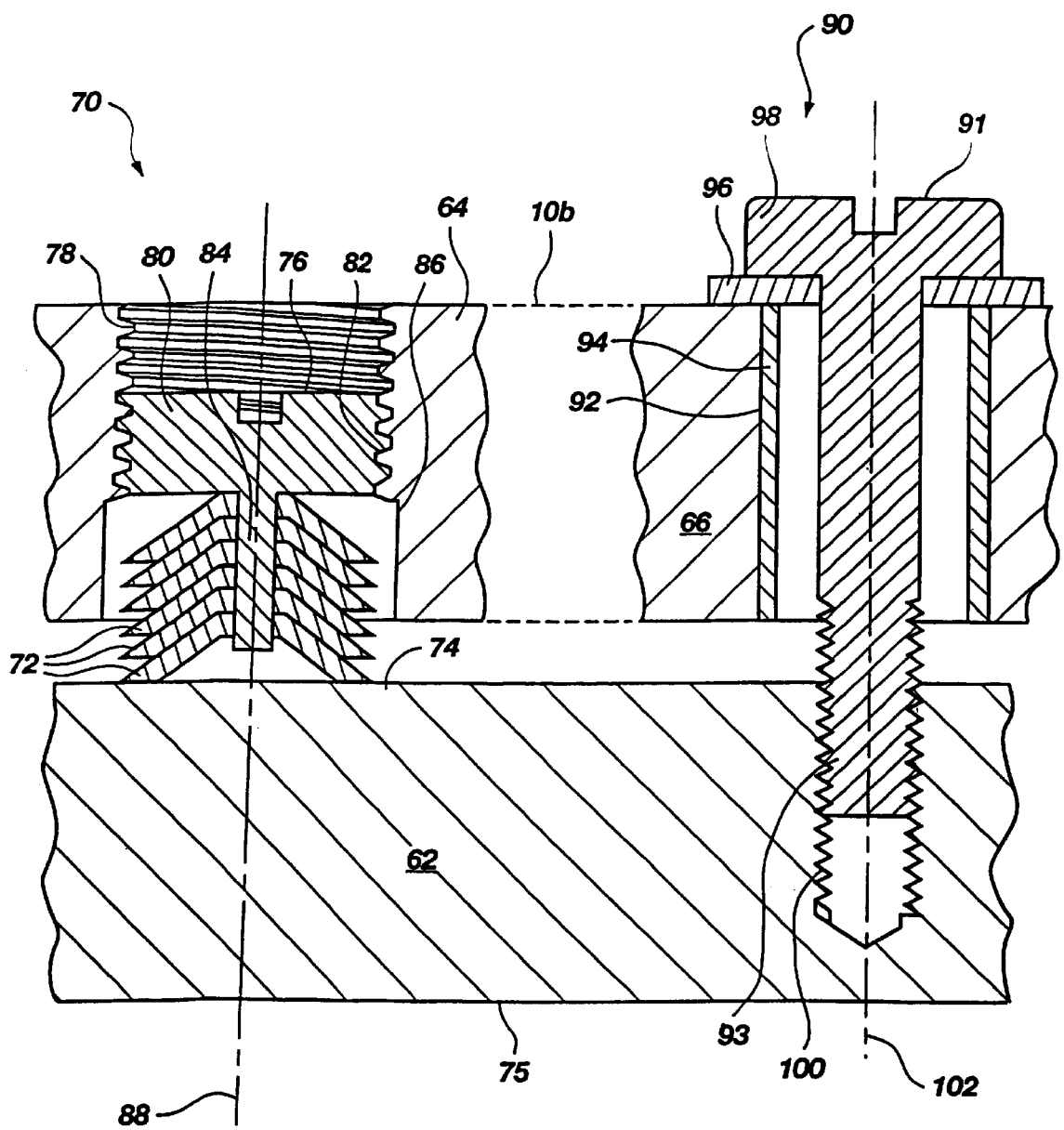
FIG. 3 is an enlarged cross-sectional side view of a mold chase and floating biased plate of the biased floating plate apparatus of the invention, as taken along line 3—3 of FIG. 2.

A biased floating plate apparatus 60 of the invention is shown in FIGS. 1–3 as including a first member, i.e. floating plate 62, and a second member 64 depicted as an H-shaped mold chase. The mold chase 64 is shown as comprising a horizontal plate 66 with a vertical compression wall 68 on each side. The first member 62 is positioned between the vertical compression walls 68 for vertical movement relative to the second member 64, i.e. between an abutment position therewith and a maximum spaced-apart position. The "maximum spaced-apart position" is defined herein as the adjustable spaced position at which the first and second members 62, 64 are held by a fastening apparatus 90, but from which the members may be compressed toward each other. It is noted that the first member 62 may be mounted above or below the horizontal plate 66 of the second member 64, depending upon the configuration of the molding machine. The use of the terms "upper" and "lower" in referring to elements or positions in the floating plate apparatus is pertinent to the depictions of the figures, but it is understood that the elements and positions may be inverted.

In use, downward compressive forces 28 are applied by force exerting means, not shown, to the upper ends 69 of the vertical compression walls 68, and the force is transmitted through the vertical compression walls 68 to the horizontal plate 66, and through compressible biasing apparatus 70 to the floating plate 62. The compressive forces 28 are then directed downwardly through the lower surface 75 of the floating plate 62 to an underlying mold plate or other plate by which forces are directed to a pair of mold plates. The compressive forces sealably clamp the substrate 40 between the mold plates 12, 14.

Turning now to FIGS. 2 and 3, the biasing apparatus 70 is depicted as a series of stacked concentric conical spring members 72 compressively held against a first surface 74 of the floating plate 62 by a screw 76 in threaded hole 78 through horizontal plate 66. Screw 76 is shown with a head 80 having threads 82 and a shaft 84 which maintains the spring members 72 in alignment. A portion 86 of threaded hole 78 is enlarged to permit radial expansion of the compressed spring members 72. The number and/or compression characteristics of spring members 72 may be varied to achieve the desired amount of force and desired stress/strain ratio suitable for use with the mold material.

A plurality of biasing apparatus 70, each having a center line 88, is spaced to provide evenly distributed biasing over the entire floating plate 62, and thus to the mold plates 12, 14. Compressive forces are directed parallel to center line 88.

In accordance with the invention, the first member 62, e.g. floating plate, is attached to the second member 64, e.g. mold chase, by a fastening apparatus 90. The fastening apparatus 90 includes retainer bolt or screw 91 with a threaded stem 93 aligned along center line 102 having a head thereon having washer 96 thereunder passing through a hole 92 (thru-hole 92) in the horizontal plate 66 having spacing collar 94 located therein. The spacing collar 94 is shown within hole 92, and the washer 96 underlies the retainer bolt or screw head 98. The screw 91 is mounted in a threaded hole 100 in the floating plate 62, and may be rotated to pre-compress, i.e. pre-load, the first member 62 to the second member 64. The spacing collar 94 is slidably retained within hole 92 and may be used to adjust the spacing between plates 62 and 66 with respect to the floating plate 62. Any desired number of fastening apparatus 90 which includes retainer bolt 91, each located in a spacing collar 94 slidably retained within a hole 92, may be used.

The biased floating plate apparatus 60 is configured for use in a pre-loaded state wherein it has a particular thickness dimension t between the upper surface 106 of the horizontal plate 66 and the lower surface 75 of the floating plate 62 (see FIG. 2). As pre-loaded, the retainer bolt or screw 91 is in a state of tension and the biasing apparatus 70 is in a state of compression.

Figure 7:
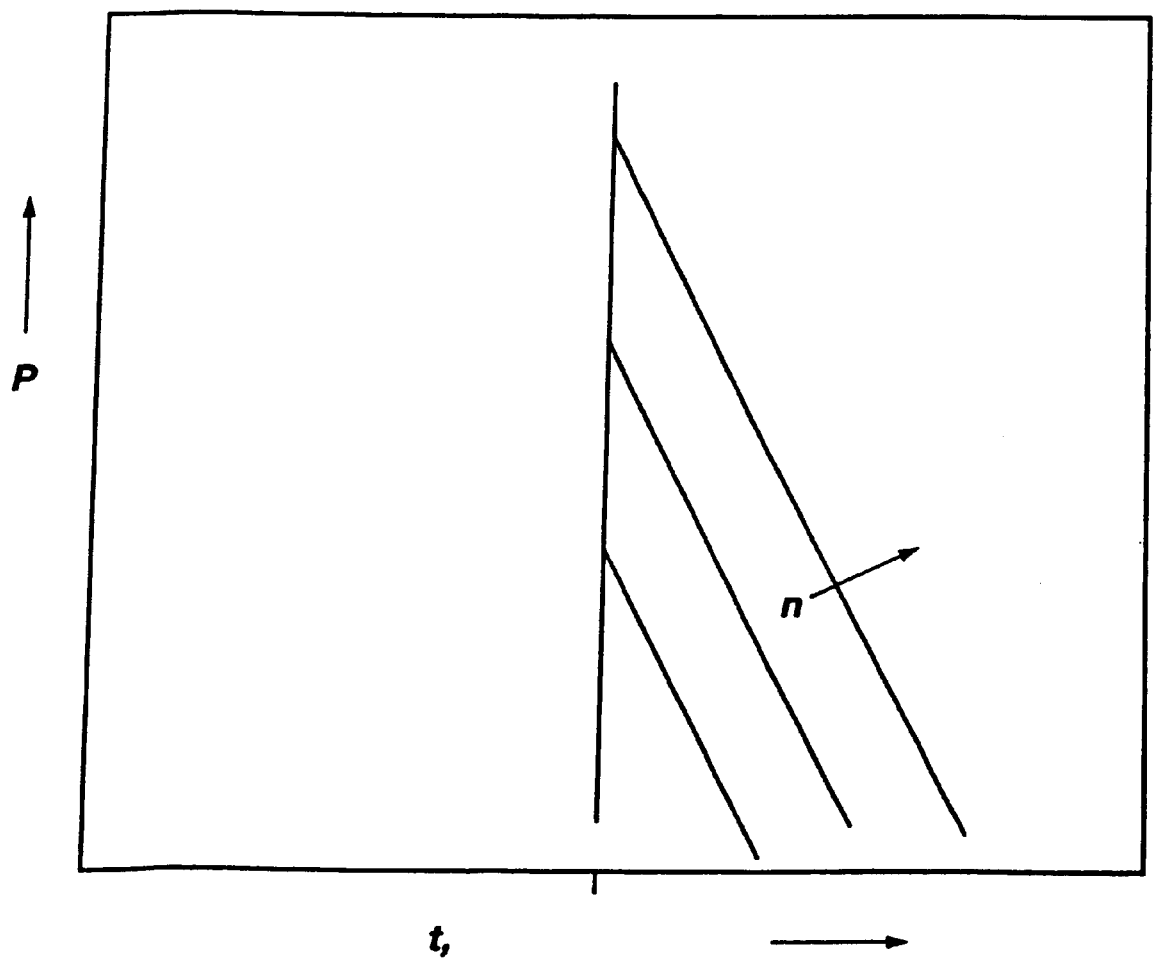
FIG. 7 is a graphical representation of an exemplary relationship between compressive movement and compressive force exerted by a biased floating plate apparatus of the invention.

As shown in FIG. 7, the relationship between the compressive force P exerted by the biased floating plate apparatus 60 and the thickness dimension t is inverse in nature. As applied to the apparatus of FIG. 1, the particular line is dependent upon the number n of spring members 72 in each biasing apparatus 70. As n is increased, the compressive force P at a given position t increases, so that the apparatus may be easily adjusted for variations in substrate thickness.

The retainer bolt or screw 91 as well as the screw 76 may be configured for rotatable adjustment by a screwdriver, Allen wrench or other suitable tool or apparatus.

Figure 4:
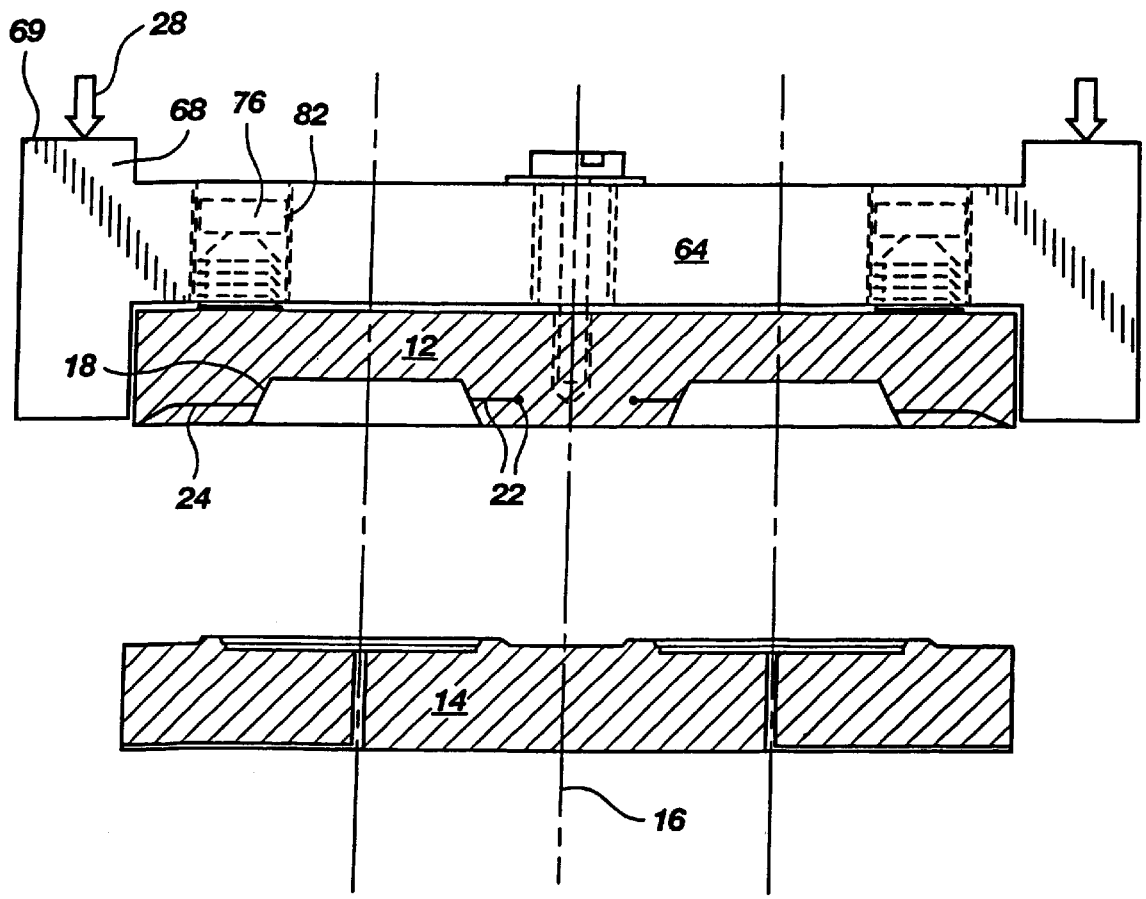
FIG. 4 is an exploded side view of a portion of a molding machine, showing another embodiment of a mold chase, floating biased plate and lower mold plate of the biased floating plate apparatus of the invention.

As shown in FIG. 4, the biased floating plate 62 may comprise the upper or lower mold plate 12 or 14, respectively. Thus, the need for a separate floating plate is avoided. The upper mold plate 12 is shown as a floating plate attached to the mold chase 64 and spring-loaded thereby. The mold chase 64 and lower mold plate 14 are as previously described. As depicted, the feed runners 22 have inlets on the upper surface 106 of the upper mold plate 12 away from the vertical compression walls 68. The vent runners 24 are also shown as avoiding interference by the vertical compression walls 68.

It is apparent to those skilled in the art that various changes and modifications may be made to the biased floating plate apparatus and relief/venting apparatus of the invention as disclosed herein without departing from the spirit and scope of the invention as defined in the following claims.

What is claimed is:

1. An encapsulation method in a molding machine for an electronic device mounted on a first side of a planar substrate comprising:

providing an upper mold plate having a cavity therein and at least one clamping ridge located thereon and a lower mold plate having a cavity therein and at least one clamping ridge located thereon;

providing apparatus for exerting a force;

providing a biased floating plate apparatus for providing adjustable compensation for substrates of varying thicknesses, said biased floating plate apparatus having a plurality of spring members;

mating said upper mold plate and said lower mold plate for enclosing said electronic device and at least a portion of said planar substrate;

clamping said at least a portion of said planar substrate between said upper mold plate and said lower mold plate using said at least one clamping ridge of said upper mold plate for contacting a portion of said planar substrate and using said at least one clamping ridge of said lower mold plate for contacting a portion of said planar substrate;

compressing said upper mold plate and said lower mold plate for sealably contacting portions of said planar substrate therebetween using said apparatus for exerting said force;

compensating for differing thicknesses of said planar substrate using said biased floating plate apparatus for providing adjustable compensation for substrates of varying thicknesses; and injecting plastic material into said cavities of said upper mold plate and said lower mold plate.

2. The method of claim 1, further comprising:

venting gases from said cavities of said upper mold plate and said lower mold plate displaced by said plastic material.

3. The method of claim 1, wherein said lower mold plate includes raised relief and vent apparatus in said lower mold plate for underlying said planar substrate and for collecting gases for venting said gases.

4. The method of claim 1, wherein said biased floating plate apparatus comprises:

a first planar plate;

a second planar plate; and attaching apparatus attaching said first planar plate to said second planar plate for movement of said first and second planar plates between and abutment position and a spaced-apart position, said plurality of spring members of said biased floating plate apparatus biasing said first and second planar plates to said spaced-apart position.

5. The method of claim 4, wherein said biased floating plate apparatus includes a plurality of stacked concentric conical spring members.

6. The method of claim 5, wherein said plurality of stacked concentric conical spring members are in compression in said spaced-apart position.

7. The method of claim 4, wherein said spaced-apart position is adjustable.

8. The method of claim 4, wherein said spaced-apart position is adjustable by actuation of said attaching apparatus attaching said first planar plate to said second planar plate.

9. The method of claim 1, wherein said biased floating plate apparatus comprises:

a first plate comprising one of the upper mold plate and the lower mold plate;

a second plate; and attaching members attaching said first plate to said second plate whereby said first and second plates may move between an abutment position and a spaced-apart position, said plurality of spring members biasing said first and second plates to said spaced-apart position.

10. The method of claim 9, wherein said lower mold plate includes raised relief and vent apparatus in said lower mold plate for underlying said planar substrate and for collecting gases for venting said gases.

11. The method of claim 9, wherein said biased floating plate apparatus includes a plurality of stacked concentric conical spring members.

12. The method of claim 11, wherein said plurality of stacked concentric conical spring members are in compression in said spaced-apart position.

13. The method of claim 12, wherein said spaced-apart position is adjustable.

14. The method of claim 12, wherein said maximum spaced-apart position is adjustable by actuation of said attaching members.

15. The method of claim 12, wherein said first plate comprises an upper mold plate.

* * * * *